United States Patent
Pan et al.

(10) Patent No.: US 9,508,674 B2
(45) Date of Patent: Nov. 29, 2016

(54) WARPAGE CONTROL OF SEMICONDUCTOR DIE PACKAGE

(71) Applicant: Taiwan Semiconductor Manufacturing Company, Ltd., Hsin-Chu (TW)

(72) Inventors: Kuo Lung Pan, Hsin-Chu (TW); Ching-Wen Hsiao, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 135 days.

(21) Appl. No.: 13/826,835

(22) Filed: Mar. 14, 2013

(65) Prior Publication Data

US 2014/0131858 A1 May 15, 2014

Related U.S. Application Data

(60) Provisional application No. 61/726,411, filed on Nov. 14, 2012.

(51) Int. Cl.
  *H01L 23/00* (2006.01)
  *H01L 23/31* (2006.01)
  *H01L 21/56* (2006.01)

(52) U.S. Cl.
  CPC ........... *H01L 24/82* (2013.01); *H01L 23/3128* (2013.01); *H01L 23/562* (2013.01); *H01L 24/19* (2013.01); *H01L 24/92* (2013.01); *H01L 21/568* (2013.01); *H01L 24/13* (2013.01); *H01L 24/29* (2013.01); *H01L 24/32* (2013.01); *H01L 24/73* (2013.01); *H01L 2224/12105* (2013.01); *H01L 2224/13022* (2013.01);

(Continued)

(58) Field of Classification Search
  CPC ............... H01L 2224/48091; H01L 2224/97; H01L 2924/1306; H01L 2224/81; H01L 2924/00; H01L 2924/00014; H01L 21/561; H01L 2224/16225; H01L 2224/16227; H01L 2224/73265; H01L 2225/06517; H01L 2225/06548
  USPC ........... 257/E21.503, E23.191, 774; 438/108
  See application file for complete search history.

(56) References Cited

U.S. PATENT DOCUMENTS

| | | | | |
|---|---|---|---|---|
| 5,976,710 A | * | 11/1999 | Sachdev | H01L 23/49894 257/40 |
| 8,298,944 B1 | * | 10/2012 | West | H01L 23/562 257/621 |
| 2006/0027924 A1 | * | 2/2006 | Chen | H01L 21/288 257/751 |

(Continued)

FOREIGN PATENT DOCUMENTS

| KR | 1020080077936 | 8/2008 |
|---|---|---|
| KR | 1020080082545 | 9/2008 |

*Primary Examiner* — Stephen W Smoot
*Assistant Examiner* — Edward Chin
(74) *Attorney, Agent, or Firm* — Slater Matsil, LLP

(57) ABSTRACT

Various embodiments of mechanisms for forming a die package using a compressive dielectric layer to contact and to surround through substrate vias (TSVs) in the die package are provided. The compressive dielectric layer reduces or eliminates bowing of the die package. As a result, the risk of broken redistribution layer (RDL) due to bowing is reduced or eliminated. In addition, the compressive dielectric layer, which is formed between the conductive TSV columns and surrounding molding compound, improves the adhesion between the conductive TSV columns and the molding compound. Consequently, the reliability of the die package is improved.

20 Claims, 12 Drawing Sheets

(52) U.S. Cl.
CPC ............... *H01L 2224/13082* (2013.01); *H01L 2224/13147* (2013.01); *H01L 2224/2919* (2013.01); *H01L 2224/29191* (2013.01); *H01L 2224/32225* (2013.01); *H01L 2224/73267* (2013.01); *H01L 2224/92244* (2013.01); *H01L 2924/1305* (2013.01); *H01L 2924/13091* (2013.01); *H01L 2924/15311* (2013.01); *H01L 2924/181* (2013.01); *H01L 2924/18162* (2013.01)

(56) References Cited

U.S. PATENT DOCUMENTS

| | | | |
|---|---|---|---|
| 2008/0150145 A1* | 6/2008 | King | H01L 21/76807 257/762 |
| 2008/0197478 A1* | 8/2008 | Yang | H01L 21/568 257/698 |
| 2008/0197513 A1* | 8/2008 | Restaino | H01L 21/76822 257/784 |
| 2008/0217761 A1* | 9/2008 | Yang | H01L 24/24 257/700 |
| 2009/0236686 A1* | 9/2009 | Shim | H01L 21/568 257/528 |
| 2009/0309212 A1* | 12/2009 | Shim | H01L 21/568 257/700 |
| 2010/0078778 A1 | 4/2010 | Barth et al. | |
| 2010/0105169 A1* | 4/2010 | Lee | H01L 21/76898 438/107 |
| 2011/0037169 A1 | 2/2011 | Pagaila | |
| 2011/0227227 A1* | 9/2011 | West | H01L 21/76898 257/757 |
| 2011/0254160 A1* | 10/2011 | Tsai | H01L 21/486 257/738 |
| 2012/0104623 A1* | 5/2012 | Pagaila | H01L 23/13 257/774 |
| 2012/0112355 A1 | 5/2012 | Pagaila et al. | |
| 2012/0164827 A1 | 6/2012 | Rajagopalan et al. | |
| 2012/0175732 A1 | 7/2012 | Lin et al. | |
| 2012/0175774 A1* | 7/2012 | West | H01L 23/3128 257/751 |
| 2013/0134582 A1 | 5/2013 | Yu et al. | |
| 2013/0146950 A1* | 6/2013 | Li | H01L 29/6653 257/288 |
| 2013/0168848 A1 | 7/2013 | Lin et al. | |

* cited by examiner

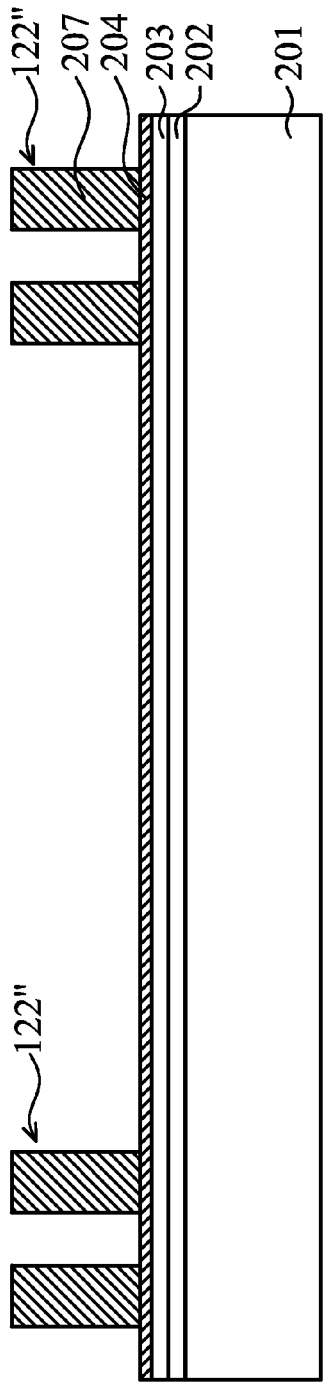
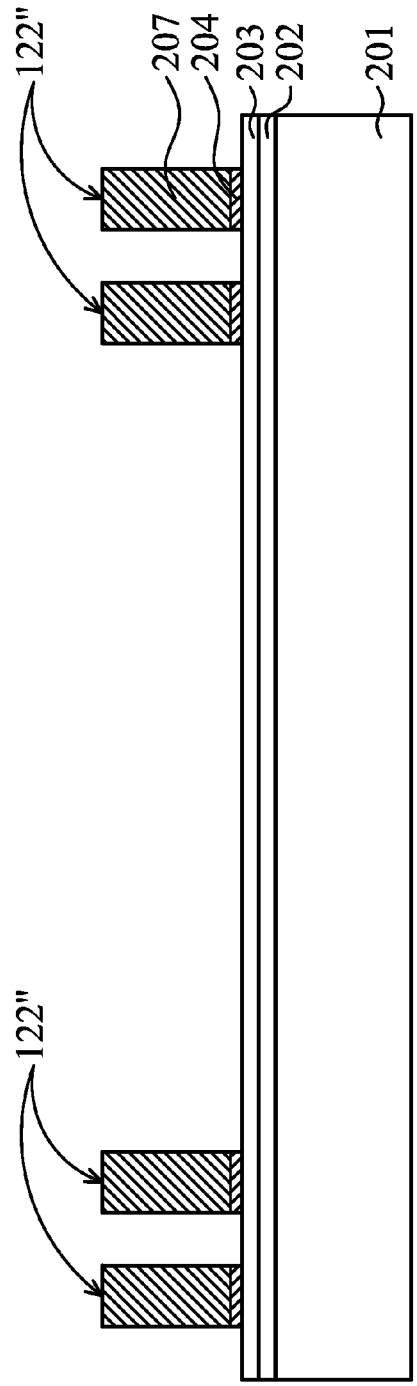
Fig. 2C
Fig. 2D

WARPAGE CONTROL OF SEMICONDUCTOR DIE PACKAGE

This application claims the benefit of U.S. Provisional Application Ser. No. 61/726,411, filed on Nov. 14, 2012, entitled "Warpage Control of Semiconductor Die Package," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A-2I show cross-sectional views of a sequential process flow of preparing a die package, in accordance with some embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are then bonded with the devices aligned. Through-substrate-vias (TSVs), also referred to as through-silicon-vias or through-wafer vias in some embodiments, are increasingly used as a way of implementing 3D ICs. TSVs are often used in 3D ICs and stacked dies to provide electrical connections and/or to assist in heat dissipation. There are challenges in forming TSVs in 3D ICs and stacked dies.

Figure 1A:
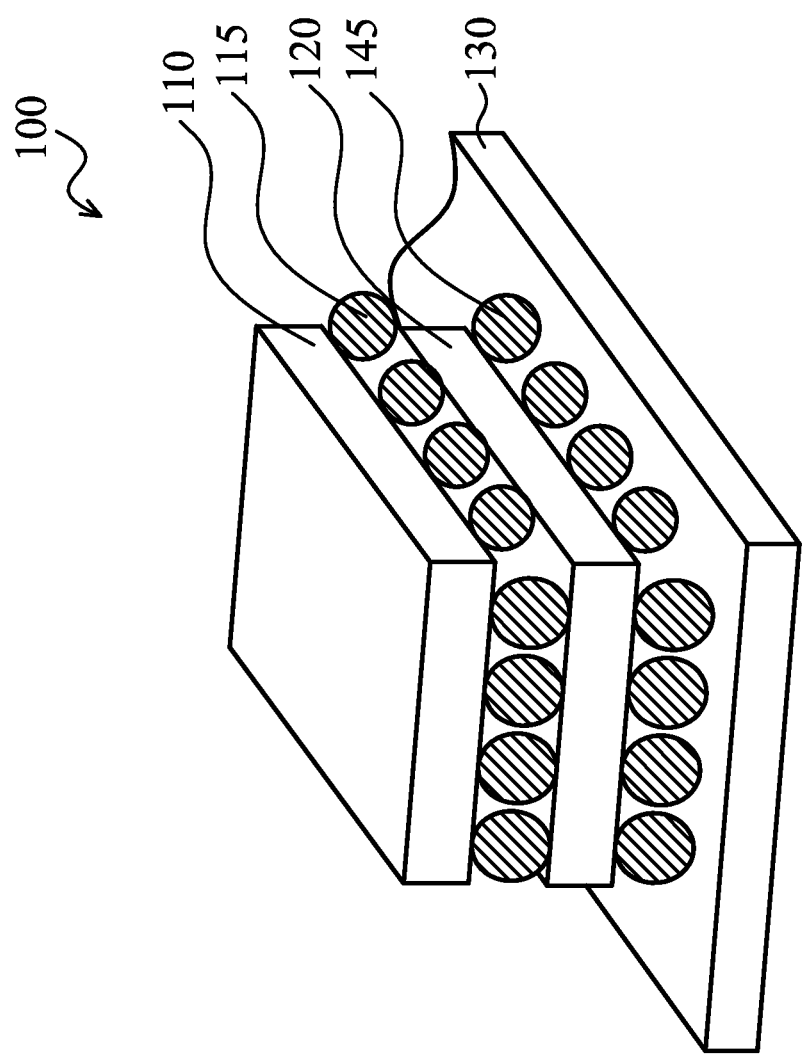
FIG. 1A is a perspective view of a package structure, in accordance with some embodiments.

FIG. 1A is a perspective view of a package structure 100 including a package 110 bonded to another package 120, which is further bonded to another substrate 130 in accordance with some embodiments. Each of die packages 110 and 120 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. Package 120 includes through substrate vias (TSVs) and function as an interposer, in accordance with some embodiments.

Substrate 130 may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals. In some embodiments, substrate 130 is a multiple-layer circuit board. Package 110 is bonded to package 120 via connectors 115, and package 120 is bonded to substrate 130 via external connectors 145. In some embodiments, the external connectors 145 are bonded bump structures, such as bonded solder bumps, or bonded copper posts with a joining solder layer.

Figure 1B:
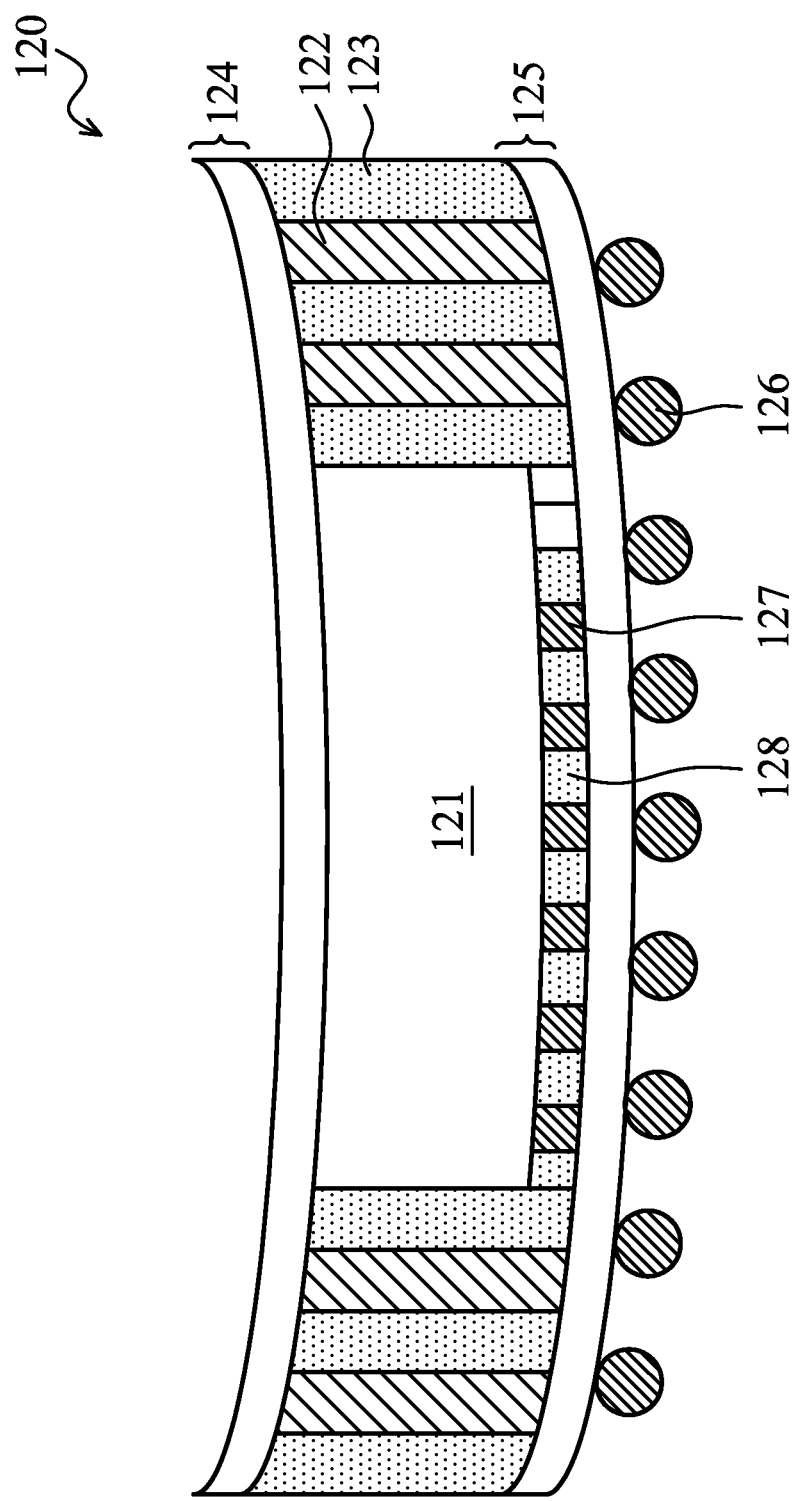
FIG. 1B show a cross-sectional view of a die package, in accordance with some embodiments.

FIG. 1B show a cross-sectional view of die package 120, in accordance with some embodiments. Package 120 includes a semiconductor die 121 and TSVs 122, which are located near the edges of package 120. Package 120 also includes a first redistribution structure 124 and a second redistribution structure 125. Each of first redistribution structure 124 and second redistribution structure 125 includes one or more redistribution layers (RDLs), which are metal interconnect layers and are surrounded by dielectric material(s). As shown in FIG. 1B, TSVs 122 are connected to both first redistribution structure 124 and second redistribution structure 125. Die 121 is connected to first redistribution structure 124 on one side and to second redistribution structure 125 on the other side via connectors 127. In some embodiments, connectors 127 are surrounded by a molding compound 128. In some embodiments, molding compound 128 is made of a polymer, such as epoxy, polyimide, polybenzoxazole (PBO), etc. In some embodiments, the molding compound 128 includes solid fillers, such as silica, or other applicable materials, to increase its strength. In some embodiments, connectors 127 are surrounded by an underfill, instead of a molding compound.

The RDLs in first redistribution structure 124 and second redistribution structure 125 enable fan-out of die 121. Package 110 bonded to package 120 may include one or more dies, which may be placed beyond the boundary of die 121 due to fan-out enabled by first redistribution structure 124. The second redistribution structure 125 is connected to contact structures 127, such as conductive bumps. In some embodiments, the conductive bumps include copper posts. The space between first redistribution structure 124 and second redistribution structure 125 (not occupied by die 121) is filled with a molding compound 123. In some embodiments, the molding compound 123 is made of a polymer, such as epoxy. In some embodiments, the molding compound 123 includes a filler, such as silica, to increase strength of the molding compound 123.

Due to varying coefficients of thermal expansion (CTEs) of different elements on package 120, package 120 bows upward at the edges, as shown in FIG. 1B in accordance with some embodiments. The way package 120 bows (or warps) upward at the edges is similar to the phenomenon of die bowing due to having a tensile film on the die. Such bowing (or warpage) is not desirable for forming package on package (PoP) structure, because bowing could cause metal/dielectric interfacial delamination to affect reliability of connections between 120 and 110. In addition, bowing of package 120 could break portions of RDLs in first redistribution structure 124 and/or second redistribution structure 125 to degrade yield. Therefore, it is desirable to reduce bowing during formation of package 120.

Figure 2A:
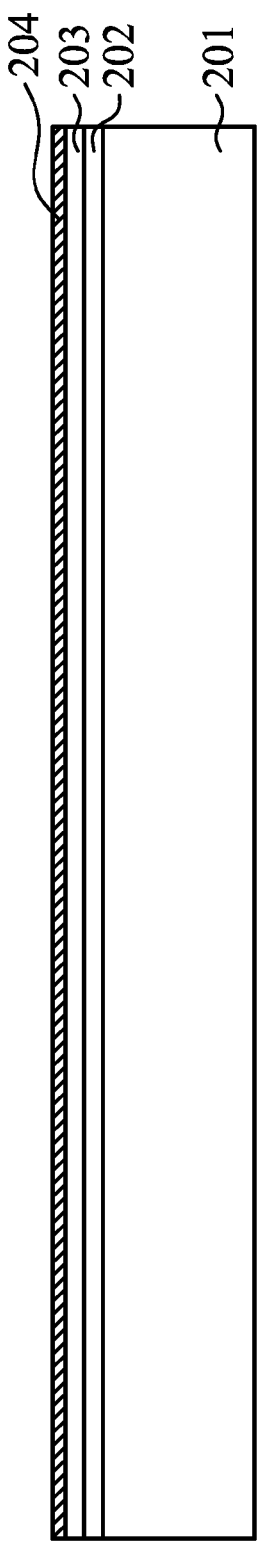

FIGS. 2A-2I show cross-sectional views of a sequential process flow of preparing a die package 120', in accordance with some embodiments. Package 120' has less bowing than package 120 described above in FIG. 1B. In some embodiments, package 120' has no observable bowing. FIG. 2A shows an adhesive layer 202, which is over carrier 201. Carrier 201 is made of glass, in accordance with some embodiments. However, other materials may also be used for carrier 201. Adhesive layer 202 is deposited or laminated over carrier 201, in some embodiments. Adhesive layer 202 may be formed of a glue, or may be a lamination layer formed of a foil. In some embodiments, adhesive layer 202 is photosensitive and is easily detached from carrier 201 by shining ultra-violet (UV) light on carrier 201 after package 120' is formed. For example, adhesive layer 202 may be a light-to-heat-conversion (LTHC) coating made by 3M Company of St. Paul, Minn.

A cushion layer 203 is then formed over the adhesive layer. The cushion layer 203 is dielectric and is made of a polymer, such as polyimide, polybenzoxazole (PBO), or benzocyclobutene (BCB), in some embodiments. In some embodiments, the cushion layer 203 has thickness in a range from about 5 µm to about 10 µm. After the cushion layer 203 is formed, a diffusion barrier and copper seed dual layer 204 is formed on the cushion layer 203. In some embodiments, the diffusion barrier layer is made of Ti and the copper seed layer is made of copper. However, the diffusion barrier layer may be made of other materials, such as TaN, or other applicable materials. The dual layer 204 is formed by a physical vapor deposition process, or sputter process in accordance with some embodiment. In some embodiments, the diffusion barrier layer has thickness in a range from about 0.05 µm to about 0.1 µm. In some embodiments, the copper seed layer has thickness in a range from about 0.3 µm to about 0.5 µm.

Figure 2B:
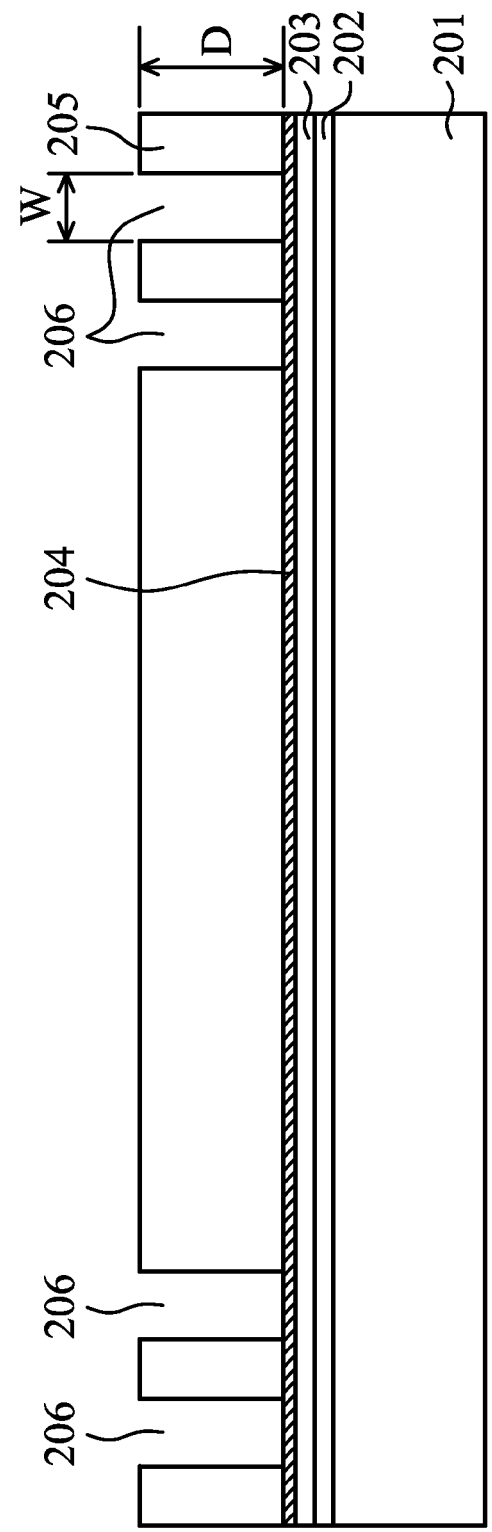

Following the deposition of the dual layer 204, a photoresist layer 205 is formed over dual layer 204, as shown in FIG. 2B in accordance with some embodiments. The photoresist layer 205 may be formed by a wet process, such as a spin-on process, or by a dry process, such as by a dry film. After the photoresist layer 205 is formed, the photoresist layer 205 is patterned to form openings 206, which are filled to form TSVs 122 described above in FIG. 1B. The processes involved include photolithography and resist development. In some embodiments, the width W of openings 206 is in a range from about 40 µm to about 90 µm. In some embodiments, the depth D of openings 206 is in a range from about 80 µm to about 120 µm.

Afterwards, a copper-containing conductive layer 207 is plated to fill openings 206, in accordance with some embodiments. The copper-containing conductive layer 207 may be made of copper or copper alloy. In some embodiments, the thickness of the copper-containing layer 207 deposited is in a range from about 80 µm to about 120 µm. Following the plating to gap-fill process, a planarization process, such as chemical-mechanical polishing (CMP) process is applied on carrier 201 to remove excess copper-containing conductive layer 207 outside openings 206. After the excess copper-containing conductive layer 207 is removed, the photoresist layer 205 is removed by an etching process, which may be a dry or a wet process. FIG. 2C shows a cross-sectional view of the structure on carrier 201 after the photoresist layer 205 is removed and conductive material in the openings 206 are exposed as (conductive) columns 122", in accordance with some embodiments.

Figure 2E:
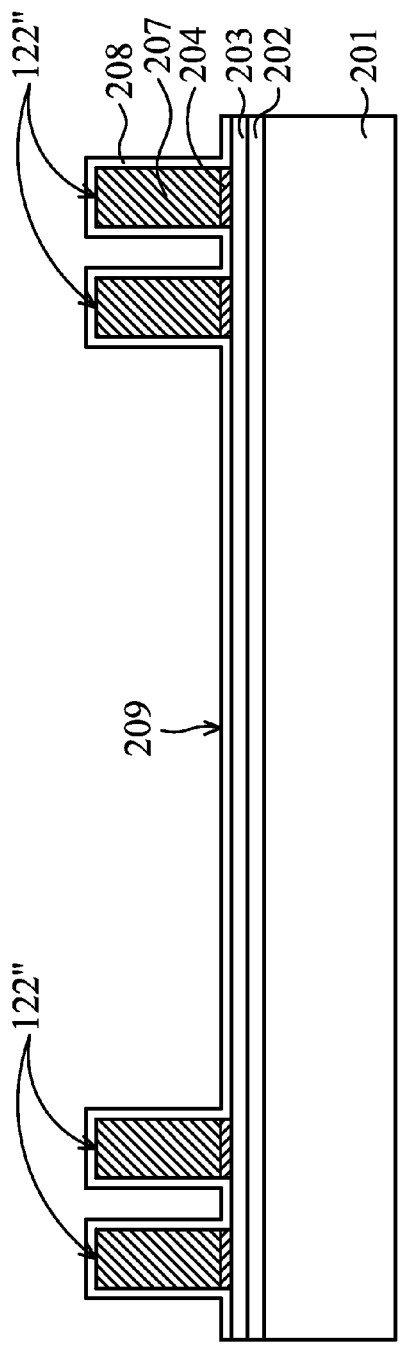

Following the removal of photoresist layer 205, the exposed diffusion barrier and copper seed dual layer 204 is removed to prevent shorting between columns 122", as shown in FIG. 2D in accordance with some embodiments. Afterwards, a compressive dielectric layer 208 is formed on the exposed surface over carrier 201 to cover the exposed surface, including the surface of columns 122" as shown in FIG. 2E in accordance with some embodiment. The stress and film thickness of the compressive dielectric layer 208 are tuned to counter the bowing effect of package 120 described above in FIG. 1B, in accordance with some embodiments. In some embodiments, the compressive dielectric layer 208 is made of SiN by plasma-enhanced chemical vapor deposition (PECVD). However, other dielectric films, such as SiON, which can be deposited with compressive stress may also be used. SiN deposited by a PECVD process adheres well on the surfaces of columns 122", which is made of a copper-containing conductive layer 207. The plasma in the PECVD could have played in a role in treating the surfaces of columns 122" to improve the adhesion. In some embodiments, the compressive stress is in a range from about 300 MPa to about 700 MPa. The thickness of layer 208 is in a range from about 14,000 Å (or 1.4 μm) to about 28,000 Å (or 2.8 μm).

Figure 2F:
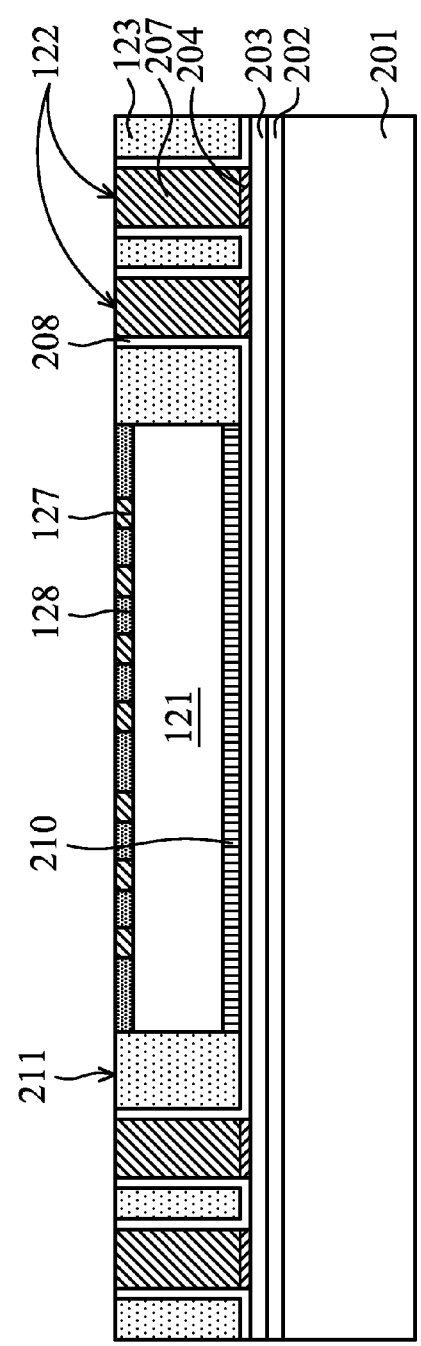

Afterwards, semiconductor die 121 is attached to a surface (such as SiN) 209 over carrier 201 by a glue layer 210, as shown in FIG. 2F in accordance with some embodiments. Glue layer 210 is made of a die attach film (DAF), in accordance with some embodiments. DAF may be made of epoxy resin, phenol resin, acrylic rubber, silica filler, or a combination thereof. FIG. 2F show that connectors 127 are facing away from the surface 209. A liquid molding compound material is then applied on the surface of compressive dielectric layer 208 over carrier 201 to fill the space between columns 122" and die 121 and to cover die 121 and columns 122". A thermal process is then applied to harden the molding compound material and to transform it into molding compound 123. Columns 122" become TSVs 122 after the molding compound 123 is formed to surround them. As mentioned above, due to the mismatch of CTEs, the thermal process applied on the structure over carrier 201 of FIG. 2F would make the structure bow upward at the edges. By depositing a compressive stress layer 208 in the structure to counter the tensile stress induced by mismatch of CTEs, the stress in the structure over carrier 201 of FIG. 2F is greatly reduced to almost zero. Consequently, the molding compound 123 adheres well to the surfaces of compressive dielectric layer 208. Studies show that the adhesion between molding compound 123 to columns 122", with an intermediate compressive dielectric layer 208, is better than molding compound 123 directly to the conductive columns of TSVs 122 of FIG. 1B. The insertion of the compressive dielectric layer 208, prior to the formation of the molding compound 123, not only reduces bowing of the die package, but also improves the adhesion between molding compound 123 and columns 122" of TSVs 122.

Figure 2G:
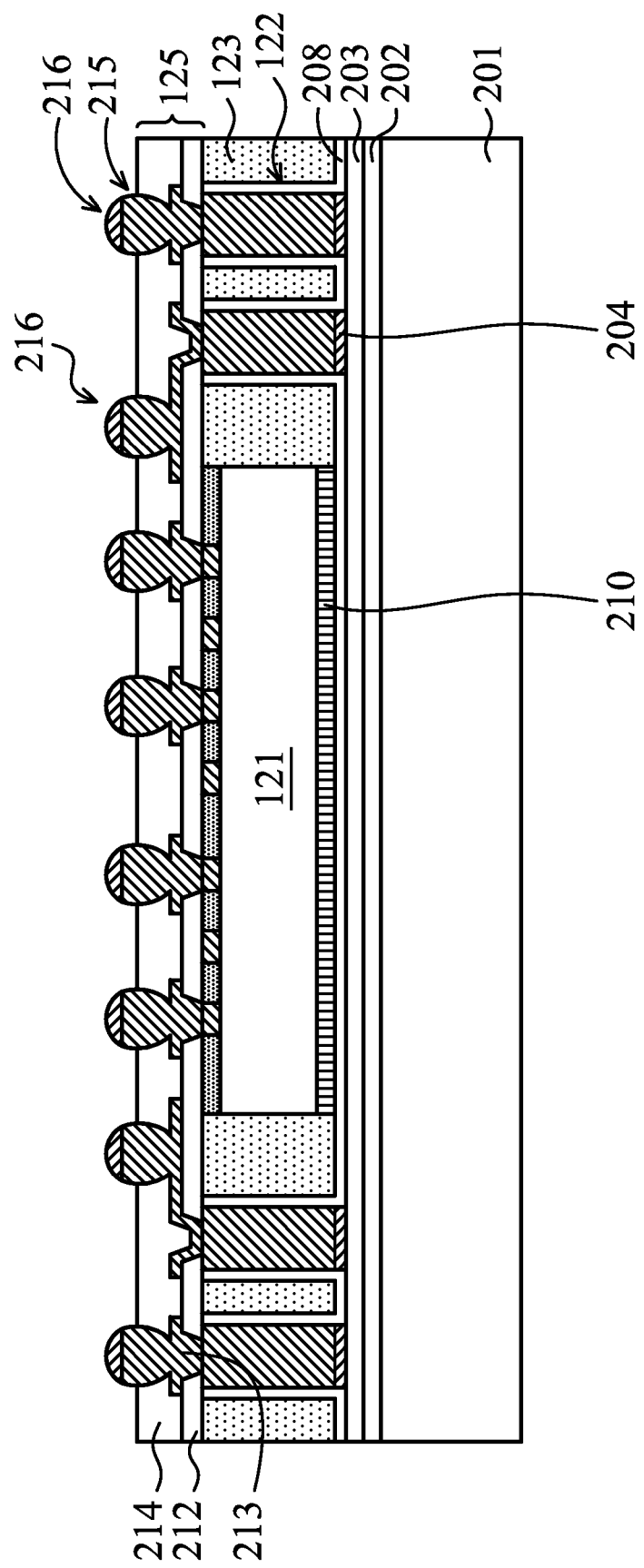

Afterwards, a planarization process is applied to remove excess molding compound 123 to expose TSVs 122 and connectors 127 of die 121, as shown in FIG. 2F in accordance with some embodiments. In some embodiments, the planarization process is a grinding process. Following the planarization process, the second redistribution layer 125 and external connectors 126 are formed over surface 211 over carrier 201 of FIG. 2F, as shown in FIG. 2G in accordance with some embodiments. FIG. 2F shows that the second redistribution layer 125 include a RDL 213, which is sandwiched between two passivation layers 212 and 214. The RDL 213 is made of a conductive material and directly contacts TSVs 122 and connectors 127 of die 121. In some embodiments, the RDL 123 is made of aluminum, aluminum alloy, copper, or copper-alloy. However, RDL 123 may be made of other types of conductive materials. The passivation layers 212 and 214 are made of dielectric material(s) and provide stress relief for bonding stress incurred during bonding external connectors 126 with substrate 130. In some embodiments, the passivation layers 212 and 214 are made of polymers, such as polyimide, polybenzoxazole (PBO), or benzocyclobutene (BCB).

FIG. 2G also shows that external connectors 126 are made of copper posts 215 with solder caps 216. In some embodiments, a under bump metallurgy (UBM) layer (not shown) is formed between the interface between RDL 213 and copper posts 215. The UBM layer also lines the sidewalls of openings of passivation layer 214 used to form copper posts 215.

Examples of redistribution structures and bonding structures, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 2H:
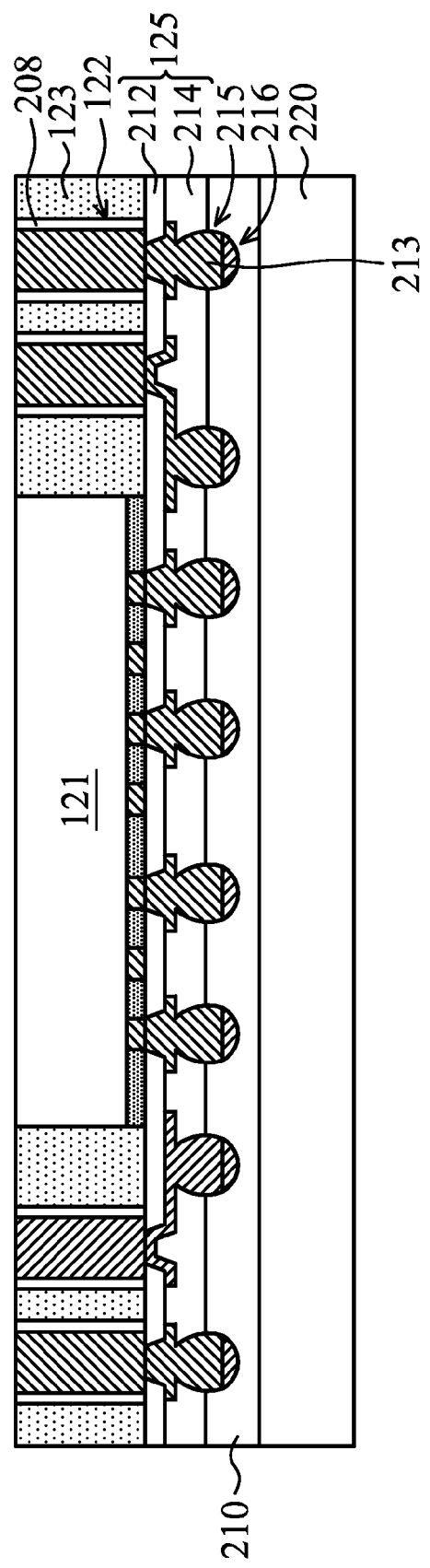

After the external connector 126 are formed, a glue 210 is applied on the surface of external connectors 126 of structure of FIG. 2G and the structure is flipped to be glued to another carrier 220, as shown in FIG. 2H in accordance with some embodiments. The cushion layer 203, the dual layer 204, the compressive dielectric layer 208 and the glue layer 210 are moved to expose TSVs 122 and die 121 by a planarization process. In some embodiments, the planarization process is a grinding process.

Figure 2I:
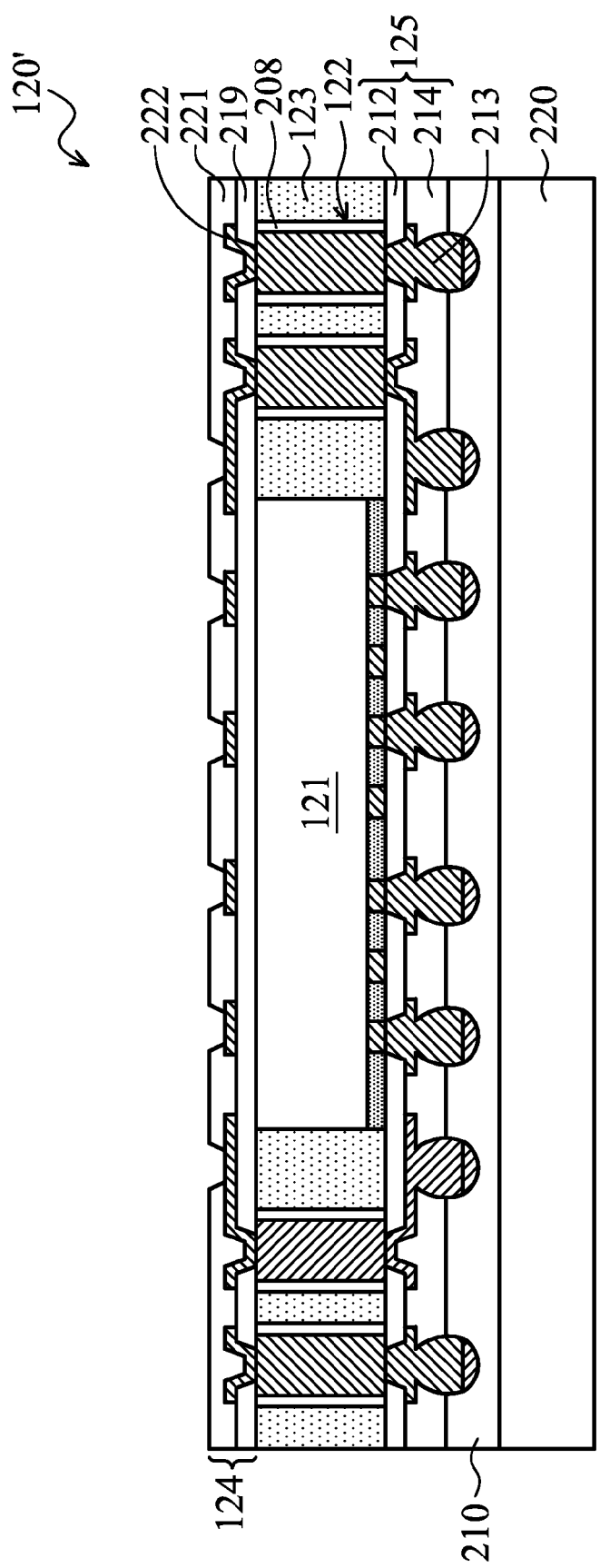

Following the planarization process, the first redistribution layer 124 is formed over surface 218 of molding compound of FIG. 2H, as shown in FIG. 2I in accordance with some embodiments. FIG. 2I shows that the first redistribution layer 125 include a RDL 222, which is sandwiched between two passivation layers 219 and 221. The RDL 222 is made of a conductive material and directly contacts TSVs 122. In some embodiments, the RDL 222 is made of aluminum, aluminum alloy, copper, or copper-alloy. However, RDL 220 may be made of other types of conductive materials. The passivation layers 219 and 221 are made of dielectric material(s) and provide stress relief for bonding stress incurred during bonding with package die 110. In some embodiments, the passivation layers 219 and 221 are made of polymers, such as polyimide, polybenzoxazole (PBO), or benzocyclobutene (BCB). In addition, bump structures (not shown) could be formed over the first redistribution structure 125, in accordance with some embodiments. In some embodiments, bonding structures (not shown), such as bumps, are formed over passivation layer 221 to contact RDL 222.

The structure above carrier 220 is then removed from carrier 220 and the glue layer 210 is also removed. The structure above carrier 220 could include multiple die packages 120', in accordance with some embodiments. After being removed from carrier 220, the structure may be attached to a tape to undergo sawing to singulate die packages 120' into individual die.

As shown in FIG. 2I, die package 120' does not bow upward or downward at the edges, in accordance with some embodiments. Package 120' described above is merely an example. Other structures can be incorporated in package 120'. For example, each of the redistribution structures 124 and 125 could have multiple RDLs, instead of a single layer RDL.

Figure 3A:
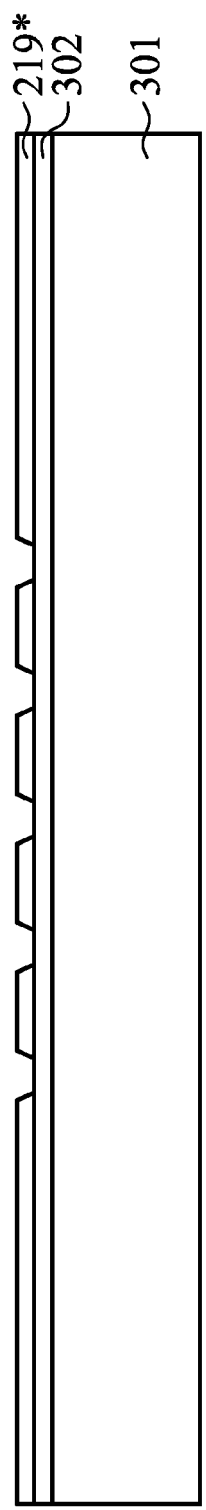
FIGS. 3A-3E show cross-sectional views of a sequential process flow of preparing a die package, in accordance with some embodiments.

FIGS. 3A-3E show cross-sectional views of a sequential process flow of preparing a die package 120*, in accordance with some embodiments. Package 120* also has less bowing than package 120 described above in FIG. 1B. FIG. 3A shows an adhesive layer 302, which is over carrier 301. Carrier 301 is made of glass, in accordance with some embodiments. However, other materials may also be used for carrier 301. Adhesive layer 302 is deposited or laminated over carrier 301, in some embodiments. Adhesive layer 302 may be formed of a material similar to adhesive layer 202 described above. A passivation layer 219* is then formed and patterned over adhesive layer 302, as shown in FIG. 3A.

Figure 3B:
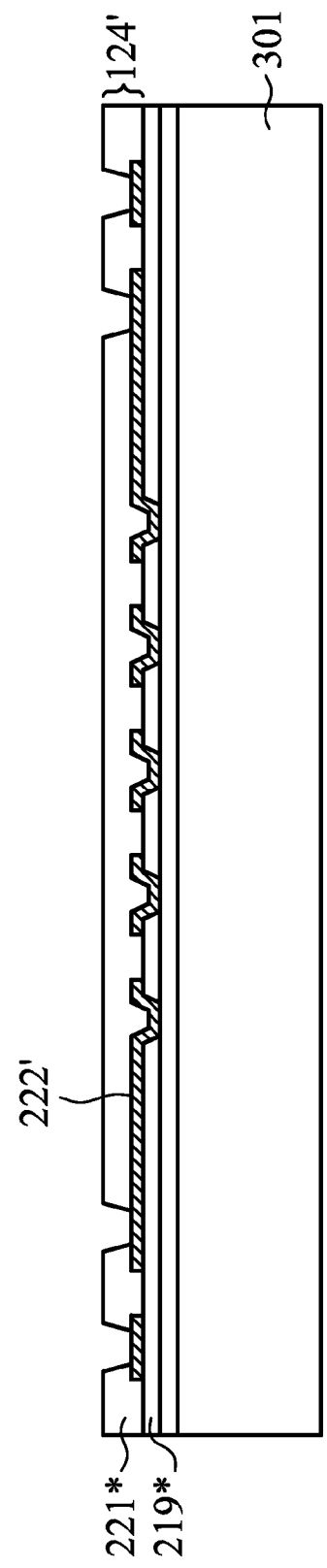
Figure 3C:
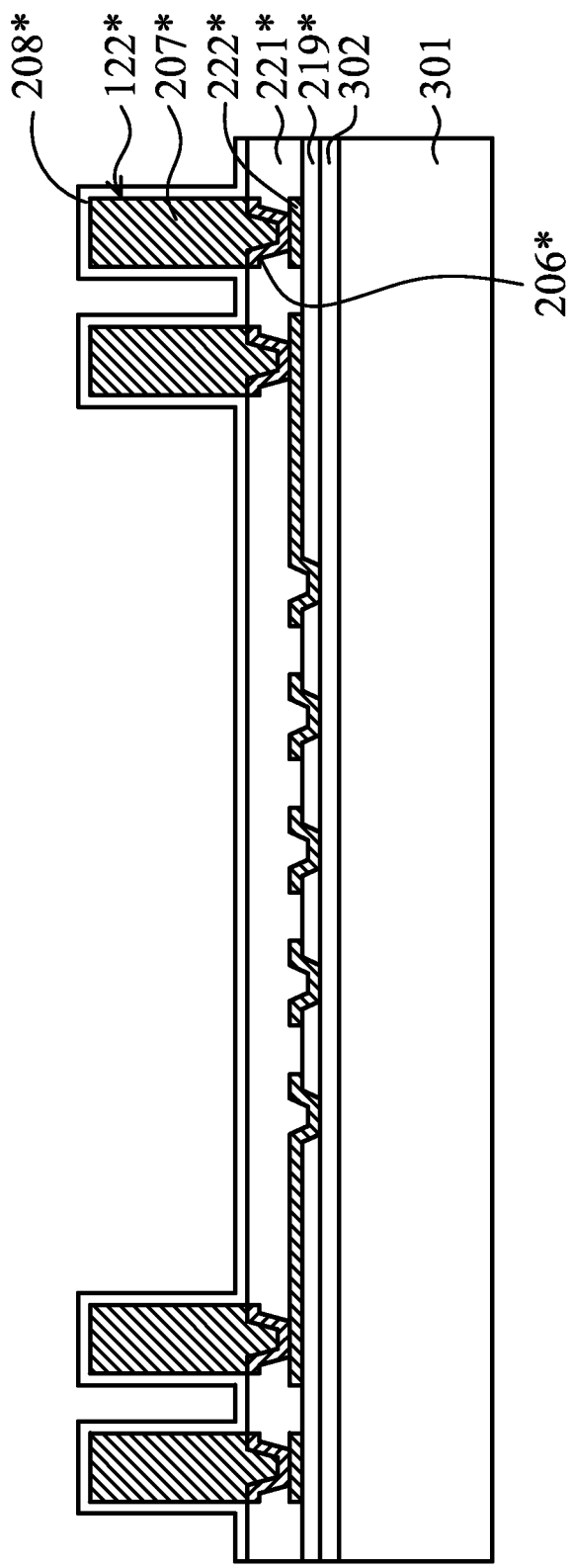

Following the formation of the passivation layer 221* described above, additional processing is performed to form a first redistribution structure 124*, as shown in FIG. 3B in accordance with some embodiments. The first redistribution structure 124* includes a RDL 222* sandwiched between passivation layers 219* and 221*. A diffusion barrier and copper seed dual layer 204* is formed on passivation layer 221*. The structure of FIG. 3B over carrier 301 is then patterned with a photoresist form openings (similar to openings 206) of TSVs 122*. A plating process is then performed to fill the openings with a copper-containing conductive layer 207*, as shown in FIG. 3C. Excess copper-containing conductive layer 207* outside the openings is then removed by a planarization process, such as CMP. The photoresist layer surrounding TSVs 122* is then removed to expose TSVs 122* as metal columns. The exposed diffusion barrier and copper seed dual layer 204* is then removed by etching. Afterwards, a compressive dielectric layer 208* is formed to cover the exposed surface of columns 122" and passivation layer 219*, as shown in FIG. 3C in accordance with some embodiments. The process sequence used in forming the structure of FIG. 3C after the structure of FIG. 3B has been described above in FIGS. 2B-2E, in accordance with some embodiments.

Figure 3D:
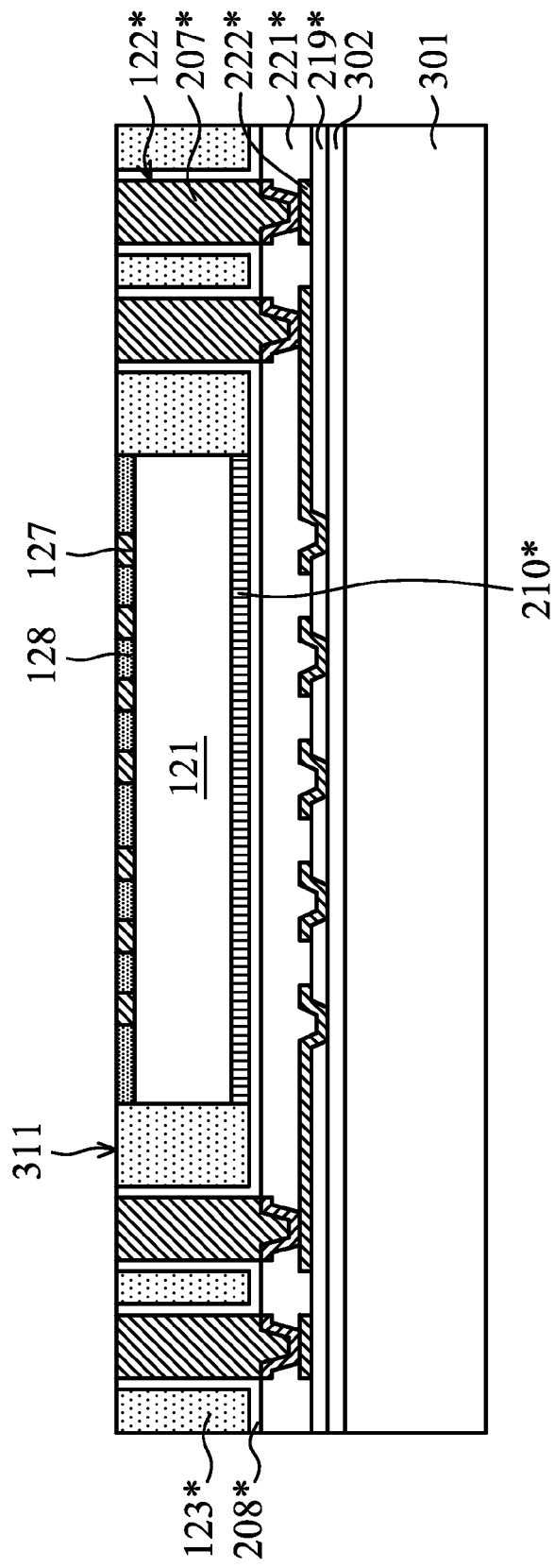

Following the deposition of the compressive dielectric layer 208*, die 121 is attached to the surface of the compressive dielectric layer 208* with assistance of a glue layer 210*, as shown in FIG. 3D, in accordance with some embodiments. Die 121 has connectors 127, which are surrounded by a molding compound 128. In some embodiments, connectors 127 are surrounded by an underfill, instead of a molding compound.

A liquid molding compound material is then applied on the surface of compressive dielectric layer 208* over carrier 301 to fill the space between columns 122" and die 121 and to cover die 121 and columns 122". A thermal process is then applied to harden the molding compound material and to transform it into molding compound 123*. Columns 122" become TSVs 122* after the molding compound 123* is formed. As mentioned above, due to the mismatch of CTEs, after the thermal process applied on the structure over carrier 301 of FIG. 3D would make the structure bow upward at the edges. By depositing a compressive stress layer 208* in the structure to counter the tensile stress induced by mismatch of CTEs, the stress in the structure over carrier 301 of FIG. 3D is greatly reduced to almost zero.

Afterwards, a planarization process is applied to remove excess molding compound 123* to expose TSVs 122* and connectors 127 of die 121, as shown in FIG. 3D in accordance with some embodiments. In some embodiments, the planarization process is a grinding process.

Figure 3E:
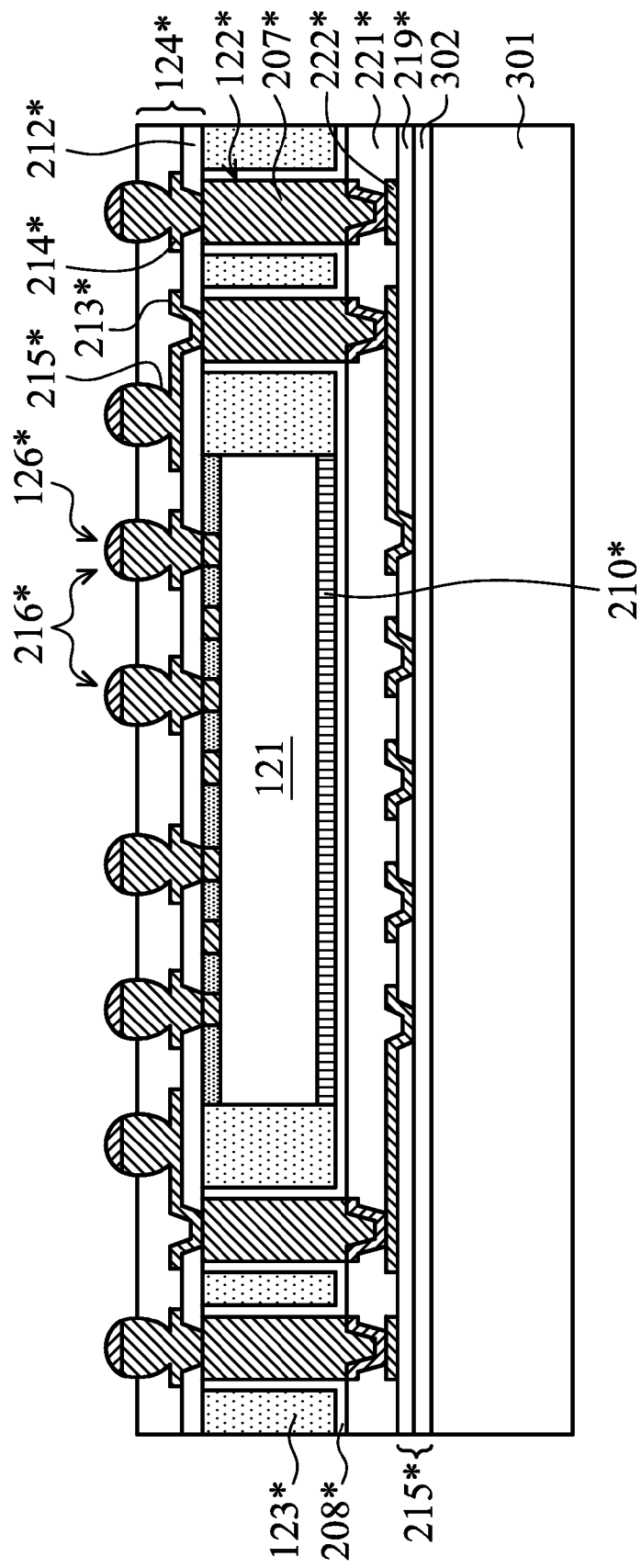

Following the planarization process, the second redistribution layer 125* and external connectors 126* are formed over surface 311 over carrier 301 of FIG. 3D, as shown in FIG. 3E in accordance with some embodiments. FIG. 3E shows that the second redistribution layer 125* include a RDL 213*, which is sandwiched between two passivation layers 212* and 214*. The RDL 213* is made of material similar to RDL 213 described above. Similarly, passivation layers 212* and 214* are made of dielectric material(s) similar to the material(s) for passivation layers 212 and 214 respectively.

FIG. 3E also shows that external connectors 126* are made of copper posts* 215 with solder caps 216*. In some embodiments, a under bump metallurgy (UBM) layer (not shown) is formed between the interface between RDL 213* and copper posts 215*. The UBM layer is similar to the UBM layer described in FIG. 2G.

Various embodiments of mechanisms for forming a die package using a compressive dielectric layer to contact and to surround TSVs in the die package are provided. The compressive dielectric layer reduces or eliminates bowing of the die package. As a result, the risk of broken RDL due to bowing is reduced or eliminated. In addition, the compressive dielectric layer, which is formed between the conductive TSV columns and surrounding molding compound, improves the adhesion between the conductive TSV columns and the molding compound. Consequently, the reliability of the die package is improved.

In some embodiments, a semiconductor die package is provided. The semiconductor die package includes a semiconductor die, and a through substrate via (TSV) formed in the semiconductor die package. The TSV is parallel to the semiconductor die, and the TSV is separated from the semiconductor die by a first molding compound and a compressive dielectric layer. The compressive dielectric layer contacts the TSV.

In some embodiments, a semiconductor die package is provided. The semiconductor die package includes a semiconductor die, and a through substrate via (TSV) formed in the semiconductor die package. The TSV is parallel to the semiconductor die, and the TSV is separated from the semiconductor die by a first molding compound and a compressive dielectric layer. The compressive dielectric layer contacts the TSV. The semiconductor die package also includes a first redistribution structure formed over the semiconductor die and the TSV. The first redistribution structure enables fan-out of the semiconductor; and the first redistribution structure has a first redistribution layer (RDL) electrically connects both the semiconductor die and the TSV.

In yet some other embodiments, a method of forming a die package is provided. The method includes providing a carrier with a first passivation layer formed over the carrier, and forming a plurality of conductive columns over the first passivation layer. The plurality of conductive columns are arranged to surround an open area. The method also includes depositing a compressive dielectric layer to cover the plurality of conductive columns, and attaching a semiconductor die to the compressive dielectric layer over the open area. The semiconductor die is surrounded by the plurality of conductive columns. The method further includes forming a molding compound to fill the space between the semiconductor die and the plurality of conductive columns and to surround the plurality of conductive columns. The plurality of conductive columns become a plurality of through substrate vias (TSVs) after being surrounded by the molding compound. In addition, the method includes forming a first redistribution structure over the semiconductor die and the plurality of TSVs. A first redistribution layer of the first redistribution structure electrically connects with the semiconductor die and the plurality of TSVs.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor die package, comprising:
a semiconductor die;
a first molding compound encapsulating the semiconductor die and physically contacting sidewalls of the semiconductor die; and
a through substrate via (TSV) formed in the semiconductor die package and extending through the first molding compound, wherein the TSV is parallel to the semiconductor die, wherein the TSV is separated from the semiconductor die by the first molding compound and a compressive dielectric layer, wherein a length of the TSV is greater than a sum of a maximum thickness of the first molding compound and a thickness of the compressive dielectric layer, and wherein the compressive dielectric layer contacts the TSV.

2. The semiconductor die package of claim 1, wherein the compressive dielectric layer is made of SiN.

3. The semiconductor die package of claim 1, wherein the compressive dielectric layer has a thickness in a range from about 1.4 µm to about 2.8 µm.

4. The semiconductor die package of claim 1, wherein the compressive dielectric layer has a stress in a range from about 300 MPa to about 700 MPa.

5. The semiconductor die package of claim 1, further comprising:
a first redistribution structure formed over the semiconductor die and the TSV, wherein the first redistribution structure enables fan-out of the semiconductor die; and wherein the first redistribution structure has a first redistribution layer (RDL) electrically connects both the semiconductor die and the TSV.

6. The semiconductor die package of claim 5, further comprising:
a second redistribution structure formed over the semiconductor die and the TSV, wherein the second redistribution structure and the first redistribution structure are on opposite sides of the semiconductor die, wherein the second redistribution structure has a second redistribution layer (RDL) electrically connects the TSV.

7. The semiconductor die package of claim 6, wherein there is a diffusion barrier layer between the TSV and the second RDL.

8. The semiconductor die package of claim 5, wherein external connectors are formed over the first redistribution structure to contact the first RDL.

9. The semiconductor die package of claim 5, wherein the first RDL connects to the semiconductor die through bumps formed over the semiconductor die.

10. The semiconductor die package of claim 9, wherein the bumps are surrounded by a second molding compound.

11. A semiconductor die package, comprising:
a semiconductor die;
a through substrate via (TSV) in the semiconductor die package, wherein a top surface of the TSV is substantially level with a top surface of the semiconductor die, and wherein the TSV is separated from the semiconductor die by a polymer molding compound and a compressive dielectric layer, and wherein the compressive dielectric layer contacts the TSV;
a first redistribution structure over the top surface of the semiconductor die and the top surface of the TSV, wherein the first redistribution structure enables fan-out of the semiconductor die, and wherein the first redistribution structure has a first redistribution layer (RDL) that electrically connects both the semiconductor die and the TSV; and
a second redistribution structure below a bottom surface of the semiconductor die, wherein the compressive dielectric layer is interposed between the second redistribution structure and the semiconductor die, and wherein the TSV electrically connects the second redistribution structure to the first redistribution structure.

12. The semiconductor die package of claim 11, wherein the TSV is a column having a top surface, sidewalls, and a bottom surface, and wherein the compressive dielectric layer surrounds the sidewalls.

13. The semiconductor die package of claim 11, wherein the TSV is in an opening extending through the polymer molding compound and the compressive dielectric layer lines the opening.

14. The semiconductor die package of claim 11, wherein the TSV is a copper pillar.

15. A semiconductor die package, comprising:
a semiconductor die having a top surface, sidewalls, and a bottom surface, the sidewalls of the semiconductor die being encapsulated by and in physical contact with a molding compound, a top surface of the molding compound being substantially level with the top surface of the semiconductor die;
a through via adjacent a sidewall of the semiconductor die, the through via being a columnar shape having sidewalls and extending through the molding compound in a direction parallel to a line extending from the top surface to the bottom surface of the semiconductor die, the top surface of the molding compound being substantially level with a top surface of the through via;
a compressive dielectric layer lining the sidewalls of the through via, the compressive dielectric layer extending along the bottom surface of the semiconductor die and physically contacting a bottom surface of the molding compound; and
a fan-out redistribution structure electrically contacting the through via and the semiconductor die and extending over the top surface of the molding compound.

16. The semiconductor die package of claim 15, wherein the compressive dielectric layer is SiN or SiON.

17. The semiconductor die package of claim 15, wherein the fan-out redistribution structure electrically and physically connects to a first end of the through via and further comprising a second fan-out redistribution structure electrically and physically contacting a second opposite end of the through via.

18. The semiconductor die package of claim 15, wherein the through via extends through a hole in the molding compound and wherein the compressive dielectric layer lines the hole in the molding compound.

19. The semiconductor die package of claim 15, wherein the compressive dielectric layer has a thickness in a range from about 1.4 μm to about 2.8 μm.

20. The semiconductor die package of claim 15, wherein the molding compound is interjacent the semiconductor die and the fan-out redistribution structure.

* * * * *